(12) United States Patent
Sugimoto et al.

(10) Patent No.: US 6,722,411 B2
(45) Date of Patent: Apr. 20, 2004

(54) MOUNTING APPARATUS AND MOUNTING METHOD

(75) Inventors: Shinichi Sugimoto, Tenri (JP); Katsunori Nagata, Yamatokoriyama (JP); Masaaki Ooga, Matsuzaka (JP); Toshihiko Nakagawa, Matsuzaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 79 days.

(21) Appl. No.: 09/865,726

(22) Filed: May 29, 2001

(65) Prior Publication Data
US 2001/0051840 A1 Dec. 13, 2001

(30) Foreign Application Priority Data

May 31, 2000 (JP) .......................... 2000-163399
Mar. 23, 2001 (JP) .......................... 2001-085339

(51) Int. Cl.$^7$ ............................................... B32B 31/10
(52) U.S. Cl. ..................... 156/351; 156/358; 156/359; 156/360; 156/378; 156/379
(58) Field of Search ................................ 156/358, 359, 156/351, 360, 378, 379; 438/7, 16; 100/46, 47, 48, 50, 51

(56) References Cited

U.S. PATENT DOCUMENTS

| 5,243,755 A | 9/1993 | Inaba et al. ................ 29/890.1 |
| 5,858,806 A | 1/1999 | Nishida |
| 6,458,236 B2 | 10/2002 | Takeshita et al. ........ 156/306.9 |

FOREIGN PATENT DOCUMENTS

| JP | 7-201932 | 8/1995 |
| JP | 8-114812 | 5/1996 |
| JP | 10-177183 | 6/1998 |
| JP | 11-54877 | 2/1999 |
| KR | 1998-064127 | 10/1998 |

OTHER PUBLICATIONS

Machine Translation of JP 11–54877 A, cited in IDS (Paper #7) on Jan. 14, 2003.
Korean Office Action with English Translation.

*Primary Examiner*—Richard Crispino
*Assistant Examiner*—George R. Koch, III
(74) *Attorney, Agent, or Firm*—Nixon & Vanderhye, PC

(57) ABSTRACT

A mounting apparatus includes: a heater head for bonding a liquid crystal display and a flexible printed circuit board by thermocompression; a cylinder as a heater head driving means for driving heater head to compress the liquid crystal display and flexible printed circuit board by a prescribed load; and a control mechanism as a stretch amount controlling means for adjusting a load change per unit of time after the heater head starts compressing the flexible printed circuit board by the cylinder as well as a time at which a required load is attained to control the stretch amount of the flexible printed circuit board by thermocompression. Preferably, the mounting apparatus is provided with a mechanism which performs measurement after preliminary bonding and which performs regular bonding while controlling based on the obtained information.

8 Claims, 8 Drawing Sheets

MOUNTING APPARATUS AND MOUNTING METHOD

BACKGROUND OF THE INVENTION

1. Field of the Invention

The present invention relates to a mounting apparatus and mounting method of mounting a flexible board onto a display board. Specifically, the mounting refers to electrically connecting terminal electrode rows. For example, the present invention relates to a mounting apparatus and mounting method of connecting a terminal electrode of a TFT (Thin Film Transistor) liquid crystal display and a terminal electrode of a TCP (Tape Carrier Package) of a flexible printed circuit board mounted with an LSI (Large Scale Integrated circuit) for driving.

2. Description of the Background Art

Referring to FIGS. 10 and 11, a conventional method of connecting a liquid crystal display 2 containing a liquid crystal layer 1 and a flexible printed circuit board 4 mounted with an LSI for driving will be described. In connecting, as shown in FIG. 10, a terminal electrode 3 of liquid crystal display 2 and a terminal electrode 5 of flexible printed circuit board 4 are bonded together, for example by thermocompression through an adhesive agent 6. For thermocompression, a cylinder-driven heater tool 8 is lowered and pressed.

FIG. 11 shows the structure of FIG. 10 viewed from above, where the terminal electrodes are bonded by thermocompression. It is generally known that flexible printed circuit board 4 stretches during thermocompression. It appears in FIG. 11 that terminal electrodes 3 and 5 are perfectly in alignment. However, it can be seen in FIG. 12, showing in enlargement outermost terminal electrodes 3 and 5, that terminal electrode 5 is displaced by a displacement amount 7 in the electrode width direction according to a stretch amount of flexible printed circuit board 4.

A common practice to adjust the stretch amount of flexible printed circuit board 4 is that an operator measures displacement amount 7 with use of a microscope or the like, and repeats thermocompression with different parameters of compressing temperature, pressure, time and so on to determine displacement amount 7. Thus, the operator must go through a continuing process of trial and error to find appropriate conditions for thermocompression.

Particularly, conventional terminal electrodes have a large pitch to allow for stretching of the flexible printed circuit board. In addition, a specific method of controlling the stretch amount of flexible printed circuit board has been unknown. For these reasons, in the conventional apparatuses, variation in stretch amount according to a material or size is restrained based on personal judgement and experience of an operator, for example, by varying an air flow as a variable parameter to adjust the lowering speed of a heater tool.

In recent years, flexible printed circuit boards are becoming more sophisticated and the pitch of terminal electrodes is reduced accordingly. This leads to the need for properly estimating the stretch amount of flexible printed circuit boards. Thus, the conventional mounting method is no longer satisfactory.

The above described conventional mounting technique suffers from three major problems.

First, the adjustment of the compressing temperature, pressure and time by cylinder-driven heater tool 8 is based on personal judgement and experience of the operator, whereby the stretch amount of flexible printed circuit board 4 is not quantitatively adjusted in the optimum manner with respect to the required adjustment amount. Depending on the skill level of the operator, such adjustment usually involves a considerable amount of time. Thus, the method is not satisfactory if the adjustment must be made in a short period of time.

Secondly, cylinder-driven heater tool 8 involves a long stroke. Thus, pressure variation in the cylinder is large and a load applied to an object fluctuates. Note that the compression pressure is obtained by dividing the load by an area subjected to compression. This causes variation is stretch amount and displacement inconsistency of terminal electrodes 3 and 5. As such, the conventional technique cannot fully cope with reduced pitches of terminal electrode rows to be connected.

Thirdly, the measurement of displacement amount 7 must be made by the operator with use of a microscope since an image processing apparatuses is unable to detect displacement amount 7 between terminal electrodes 3 and 5. The measurement involves a considerable amount of time. In addition, terminal electrode 5 of the flexible printed circuit board is usually formed by etching with a liquid agent and hence formed to have a section in a trapezoid shape as shown in FIG. 13. As a result, a measurement error of several $\mu m$ is caused, for example depending on which of positions A, B and C the operator regards as the end of terminal electrode 5. Further, there is a variation in measurement result of displacement amount 7 due to a difference in stretch amount of terminal electrode 5 between compressed and non-compressed portions. Moreover, such manual measurement by the microscope does not immediately provide a distance between central lines of terminal electrodes 5 at both ends of the terminal electrode rows of flexible printed circuit board 4, i.e., a total pitch. Thus, feedback as well as real time elimination of variation in stretch amount are impossible.

In view of the above, the present invention aims at providing a mounting apparatus and mounting method which enables detection and adjustment of a stretch amount of a flexible printed circuit board in a short period of time, and which is capable of avoiding displacement inconsistency.

SUMMARY OF THE INVENTION

To achieve the above mentioned object, a mounting apparatus according to one aspect of the present invention includes: a heater head for bonding by thermocompression a display board and a flexible print circuit board in such a way that a first terminal electrode row of the display board and a second terminal electrode row of the flexible printed circuit board are electrically connected; a heater head driving portion for driving the heater head in such a way that the heater head compresses the display board and flexible printed circuit board by a prescribed load; and a stretch amount controlling portion for adjusting a load change per unit of time after the heater head starts compressing the flexible printed circuit board by the heater head driving portion as well as the time at which a required load is attained to control the stretch amount of the second terminal electrode row caused by thermocompression.

With the above described structure, the stretch amount of the flexible printed circuit board can be controlled by adjusting the load change and the time at which the required load is attained. Thus, variation in stretch amount which has conventionally been measured based on personal judgement and experience of an operator can be eliminated. Thus, displacement inconsistency can be avoided.

A mounting apparatus according to another aspect of the present invention includes: a heater head for bonding by thermocompression a display board and a flexible printed circuit board in such a way that a first terminal electrode row of the display board and a second terminal electrode row of the flexible printed circuit board are electrically connected; a heater head driving portion for driving the heater head in such a way that the heater head compresses the display board and the flexible printed circuit board by a prescribed load; and a stretch amount controlling portion for adjusting a speed at which the heater head driving portion drives the heater head toward the flexible printed circuit board to control the stretch amount of the second terminal electrode row caused by thermocompression.

With the above described structure, the speed at which the heater head is moved toward the flexible printed circuit board is adjusted and variation in speed among compression cycles is controlled, whereby the stretch amount of the flexible printed circuit board can be controlled. As a result, displacement inconsistency can be avoided.

Preferably, the above described invention includes: a displacement amount detecting portion for detecting a displacement amount of positioning patterns formed on either side of the second terminal electrode row with respect to reference patterns formed on either side of the first terminal electrode row; a stretch amount calculating portion for calculating the stretch amount of the second terminal electrode row based on the displacement amount; and a correction amount calculating portion for calculating a correction amount corresponding to a difference between the stretch amounts of the first and second terminal electrode rows based on the stretch amount of the second terminal electrode row.

With the above described structure, the correction amount can be calculated by the correction amount calculating portion, whereby the correction amount can be accurately found in a short period of time unlike the conventional case of personal judgement and experience of the operator.

In the above described invention, preferably, the stretch amount controlling portion controls by feeding back the correction amount. With this structure, the problem associated with variation in stretch amount is accurately alleviated in real time since correction is made based on actual data, rather than on personal judgement and experience of the operator as in the conventional case.

Preferably, the above described invention includes a data holding portion for holding data regarding a relationship between an operation parameter and a stretch amount of the second terminal electrode row. The stretch amount controlling portion determines a necessary control method from data held in the data holding portion for control. With this structure, a necessary control method is rapidly determined for control. In addition, a variety of data provides better control.

In a mounting method according to one aspect of the present invention, a display board and a flexible printed circuit board are bonded by thermocompression with use of a heater head in such a way that a first terminal electrode row of the display board and a second terminal electrode row of the flexible printed circuit board are electrically connected, where a load change per unit of time after the heater head starts compressing against the flexible printed circuit board as well as the time at which a required load is attained are controlled, so that a stretch amount of the second terminal electrode row caused by thermocompression is controlled.

With the above described method, the load change and the time at which the required load is attained are adjusted to control the stretch amount of the flexible printed circuit board. Thus, variation in stretch amount which is conventionally measured based on personal judgement and experience of the operator can be eliminated. Thus, displacement inconsistency can be avoided.

In a mounting method according to another aspect of the present invention, a display board and a flexible printed circuit board are bonded by thermocompression with use of a heater head in such a way that a first terminal electrode row of the display board and second terminal electrode row of the flexible printed circuit board are electrically connected. A speed at which the heater head is moved toward the flexible printed circuit board is controlled, so that the stretch amount of the second terminal electrode row caused by thermocompression is controlled.

With the above described structure, the speed at which the heater head is moved toward the flexible printed circuit board is adjusted and variation in speed during compression is controlled, so that the stretch amount of the flexible printed circuit board can be controlled. As a result, displacement inconsistency can be avoided.

In the above described invention, preferably, control of the load change and the time at which the required load is attained refers to substantially stabilizing the load change and the time at which the required load is attained. With this structure, the stretch amount can be stabilized with a relatively simple mechanism and displacement inconsistency can be alleviated.

In the above described invention, preferably, control of the load change and the time at which the required load is attained refers to quantitative control to set the stretch amount at a desired value. With this structure, the stretch amount can be maintained at the desired value by quantitative control. As a result, displacement inconsistency can be alleviated.

Preferably, the above described invention includes: a displacement amount detecting step of detecting a displacement amount of positioning patterns formed on either side of the second terminal electrode row with respect to reference patterns formed on either side of the first terminal electrode row; a stretch amount calculating step of calculating a stretch amount of the second terminal electrode row based on the displacement amount; and a correction amount calculating step of calculating a correction amount corresponding to a difference between stretch amounts of the first and second terminal electrode rows based on the stretch amount of the second terminal electrode row, where quantitative control is performed by feeding back the correction amount.

With the above described structure, the correction amount can be rapidly and objectively found unlike the conventional case where the correction amount is measured based on personal judgement and experience of the operator for feedback control. Thus, the requirements for real time adjustment of stretch amount on a production line can be satisfied with no problem.

Preferably, the above described invention includes: a preliminary bonding step of preliminary fixing a relative position of the flexible printed circuit board and the heater head; a displacement amount detecting step performed after the preliminary bonding step; and a regular bonding step performed after the displacement amount detecting step. With this method, stable measurement is enabled since the measurement is performed with the relative position fixed. The obtained measurement result is made available for regular bonding, so that more accurate bonding is enabled.

Preferably, the above described invention includes: a relative position determining step of determining a relative positional relationship between reference patterns formed on either side of the first terminal electrode row and a relative positional relationship between positional patterns formed on either side of the second terminal electrode row; a preliminary bonding step of preliminary fixing a relative position of the flexible printed circuit board and the heater head performed after the relative position determining step; a stretch amount calculating step of calculating a stretch amount of the second terminal electrode row based on information obtained by the relative position determining step; a correction amount calculating step of calculating a correction amount corresponding to a difference between stretch amounts of the first and second terminal electrode rows based on the stretch amount of the second terminal electrode row; and a regular bonding step performed after the preliminary bonding step. With this method, the stretch amount of the second terminal electrode row can be found even if a measurement operation cannot be performed between the preliminary bonding step and the regular bonding step, whereby proper control can be performed during the regular bonding.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
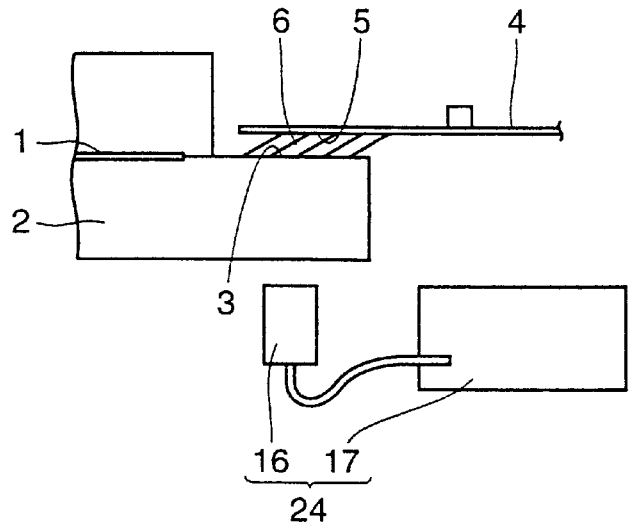
FIG. 1 is a diagram shown in conjunction with a mounting operation according to a first embodiment of the present invention.
Figure 2:
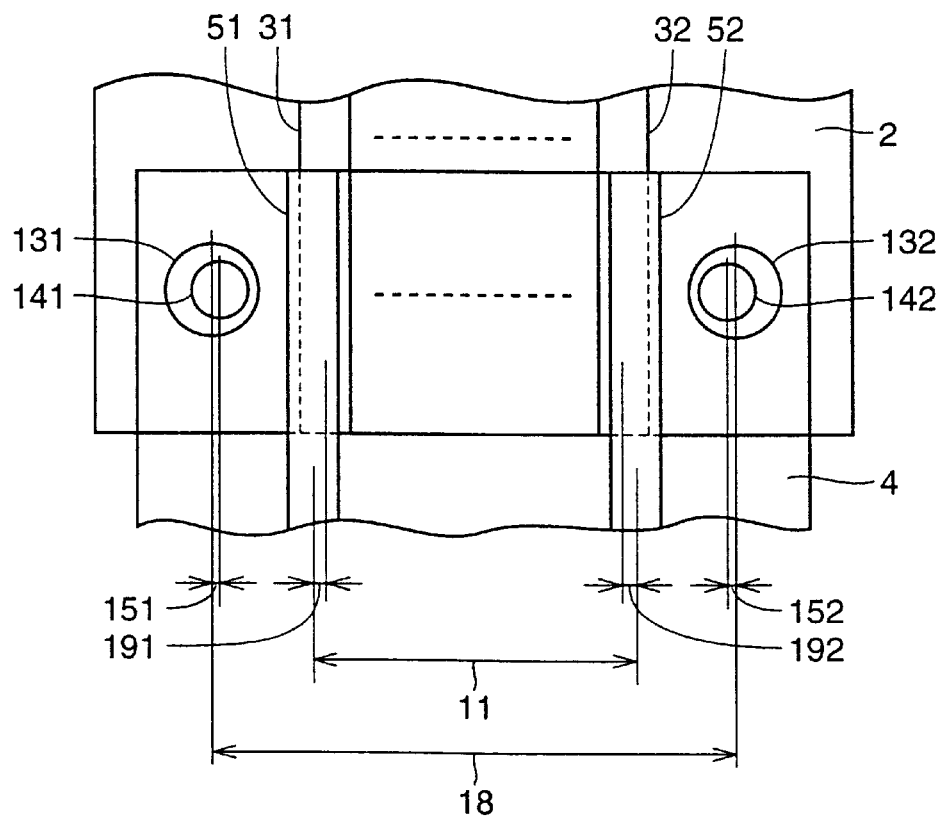
FIG. 2 is a top view showing thermocompressed components according to the first embodiment of the present invention.
Figure 3:
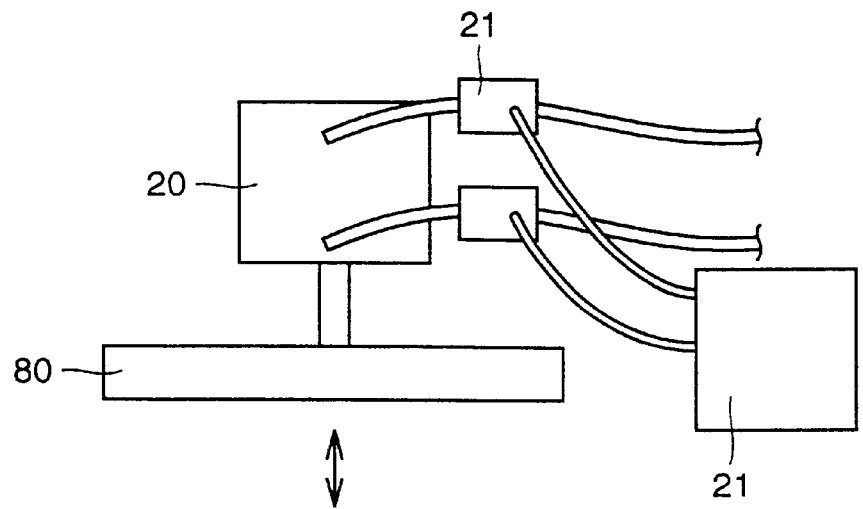
FIG. 3 is a schematic diagram showing a thermocompression apparatus according to the first embodiment of the present invention.

Referring to FIGS. 1 to 3, a mounting apparatus according to the first embodiment of the present invention will be described.

The mounting apparatus includes a heater head 80 for thermocompression, and a cylinder 20 as a heater head driving portion for driving heater head 80, as can be seen in FIG. 3. The mounting apparatus further includes a control mechanism 21 as a stretch amount controlling portion for adjusting a load change per unit of time after heater head 80 starts compression of a flexible printed circuit board 4 (see FIG. 1) as well as a time at which a required load is attained. The functions of these components will be detailed afterwards.

As shown in FIG. 1, the mounting apparatus mounts a liquid crystal display 2 onto a flexible printed circuit board 4 by bonding by thermocompression terminal electrodes 3 of liquid crystal display 2 containing a liquid crystal layer 1 and terminal electrodes 5 of flexible printed circuit board 4. For example, flexible printed circuit board 4 includes terminal electrodes 5 densely formed in stripes in a base material of polyimide. FIG. 2 shows only terminal electrode 51 and 52 at both ends of the stripe pattern as terminal electrodes 5, not showing any intervening terminal electrode. Positioning patterns 131 and 132 are formed on both sides of the terminal electrode row of flexible printed circuit board 4. On the side of liquid crystal display 2, reference patterns 141 and 142 are formed on both sides of the terminal electrode row. A pitch 18 between reference patterns 141 and 142 is known in designing flexible printed circuit board 4. Note that "a pitch" herein refers to a distance between centers.

Even if the centers of positioning patterns 131 and 132 respectively coincide with those of reference patterns 141 and 142 before bonding, after thermocompression, they are displaced due to stretching of flexible printed circuit board 4. As a result, relative displacement amounts 151 and 152, i.e., differences in position of centers, are caused as shown in FIG. 2.

Referring to FIG. 1, relative displacement amounts 151 and 152, difference in position of centers, are caused as shown in FIG. 2.

Referring to FIG. 1, relative displacement amounts 151 and 152 are sensed by an image pickup device 16 (e.g., a camera) provided in a stretch amount detecting unit 24 as a displacement amount detecting portion, and then quantitatively detected by an image processing apparatus 17. If preliminary bonding is performed before regular bonding, the image pickup and detection may be performed in any stage of the process, either before or after preliminary bonding.

In a geometrical relationship shown in FIG. 2, relative displacement amounts 151 and 152 are quantatively detected by stretch amount detecting unit 24 and subjected to an operation process with use of the stretch amount detecting portion. Based on relative displacement amounts 151 and 152, a stretch rate of pitch 18 between the positioning patterns on both sides of flexible printed circuit board 4 is calculated. The stretch amount calculating portion may be formed for example of a CPU (Central Processing Unit) and a memory with a combination of an LSI (Large Scale Integration) chips or the like. Note that a CPU provided for the other purpose may be used.

Based on the stretch rate found by the stretch amount calculating portion, a stretch amount of pitch 11 between terminal electrodes 51 and 52 at either end of flexible printed circuit board 4 is calculated. Based on the stretch amount of pitch 11, an operation process is performed by a correction amount calculating portion to find a difference between an expected stretch amount and the actual stretch amount, i.e., a correction amount. The correction amount is representative of a sum of a distance 191 between center lines of terminal electrodes 31 and 51 and a distance 192 between center lines of terminal electrodes 32 and 52. Like the above described stretch amount calculating portion, the correction amount calculating portion can also be formed of LSI chips or the like.

FIG. 3 partially shows the mounting apparatus of the present embodiment. The heater tool is also cylinder-driven as in conventional case, but has control mechanism 21 for electrically feeding back the pressure and flow of air to be supplied to cylinder 20 as a heater driving portion for driving heater head 80. Control mechanism 21 converts pressure variation in cylinder 20 to a corresponding electric signal, based on which it controls pressure and flow of air to be supplied to cylinder 20. Examples of control mechanism 21 include a commercially available electropneumatic regulator manufactured by SMC Corporation. Control mechanism 21 adjusts a load change per unit of time after heater head 80 starts compression of flexible printed circuit board 4 as well as a time at which a required load is attained.

With the mounting apparatus of the present embodiment, image pickup device 16 as a displacement amount detecting portion detects relative displacement amounts 151 and 152, and the stretch amount calculating portion and correction amount calculating portion are used to find a correction amount. Since information on the correction amount can be made available to the stretch amount controlling portion, the stretch amount can be adjusted much faster than in the conventional case.

In the present embodiment, the mounting apparatus has been described as having not only the heater head driving portion and the stretch amount controlling portion, but also the displacement amount detecting portion, stretch amount calculating portion, and correction amount calculating portion. In this case, preferably, information on the resultant correction amount is fed back for control.

However, even if the displacement amount detecting portion, stretch amount calculating portion and correction amount calculating portion are not provided, the presence of the heater head, heater head driving portion and stretch amount controlling portion would provide control of the stretch amount to produce a given effect.

Note that the stretch amount controlling portion herein used controls the pressure and flow of air to be supplied to cylinder 20 to adjust the load change per unit of time after heater head 80 starts compression of flexible printed circuit board 4 as well as the time at which the required load is attained. This is because adjustment of the load change per unit of time after starting compression and the time at which the required load is attained provides adjustment of the stretch amount of flexible printed circuit board 4.

If it is difficult to perform feed back control, the load change per unit of time after heater head 80 starts compression of flexible printed circuit board 4 and the time at which the required load is attained can be substantially fixed to stabilize to some extent the stretch amount, which is preferable.

Second Embodiment

Referring to FIGS. 1, 2 and 4 to 6, a mounting apparatus according to the second embodiment of the present invention will be described.

Figure 4:
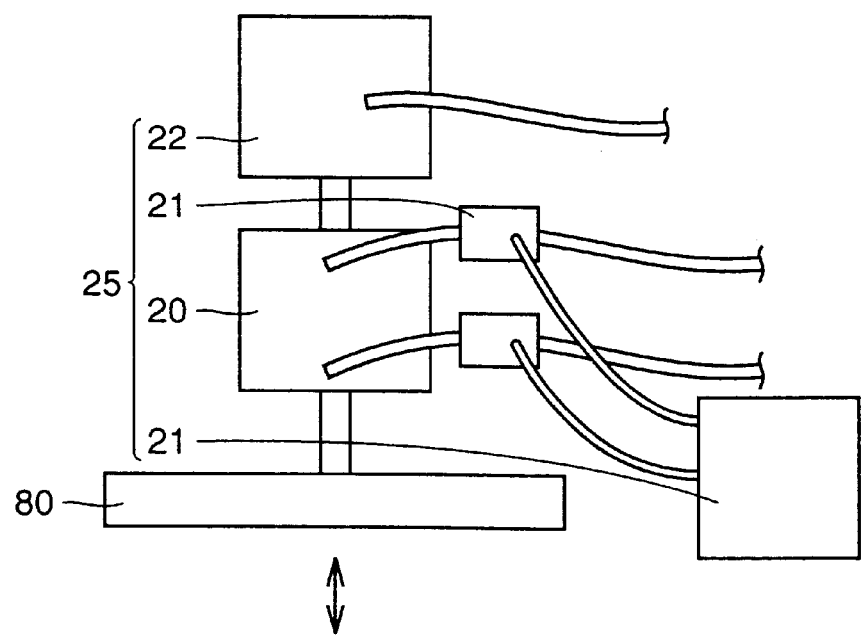
FIG. 4 is a schematic diagram showing a thermocompression apparatus according to a second embodiment of the present invention.

Referring to FIG. 4, the mounting apparatus includes a heater head 80 for thermocompression, and a cylinder 20 and a motor 22 as a heater head driving portion for driving heater head 80. The mounting apparatus further includes a control mechanism 21 as a stretch amount controlling portion for adjusting a speed at which cylinder 20 and motor 22 drive heater head 80 toward flexible printed circuit board 4 (see FIG. 1).

The operation up to calculation of a correction amount is the same as in the first embodiment. In addition, the presence of the displacement amount detecting portion, stretch amount calculating portion and correction amount calculating portion is also the same as in the first embodiment. Note that control mechanism 21 adjusts the speed at which heater head 80 is moved toward flexible printed circuit board 4.

Since the heater head driving portion is provided with motor 22, the speed of heater head 80 and the stretch amount of flexible printed circuit board 4 can be adjusted.

Figure 6:
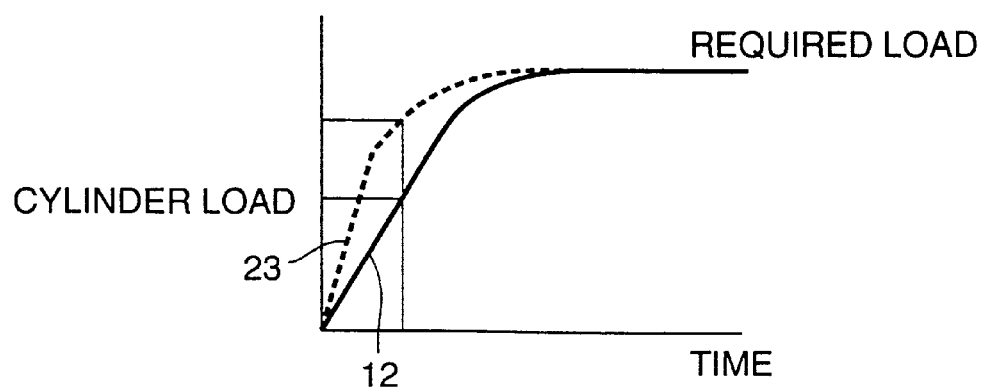
FIG. 6 is a graph showing a load change when the mounting apparatus according to the second embodiment of the present invention is used.

Motor 22 in the heater head driving portion provides a greater load change per unit of time after starting compression. FIG. 6 shows a load change shortly after compression of flexible printed circuit board 4 is started. Curves 12 and 23 respectively correspond to the cases without and with motor 22. Although it is known that flexible printed circuit board 4 stretches by application of heat, it becomes less stretchy by application of pressure. Then, the application times of various levels of pressure are adjusted according to the load change per unit of time to control the stretch amount.

In addition, use of motor 22 leads to high repeatability of the heater head movement. As a result, the stretch amount of flexible printed circuit board 4 exhibits higher repeatability, which is advantageous not only to the present embodiment but also to the first embodiment.

Figure 5:
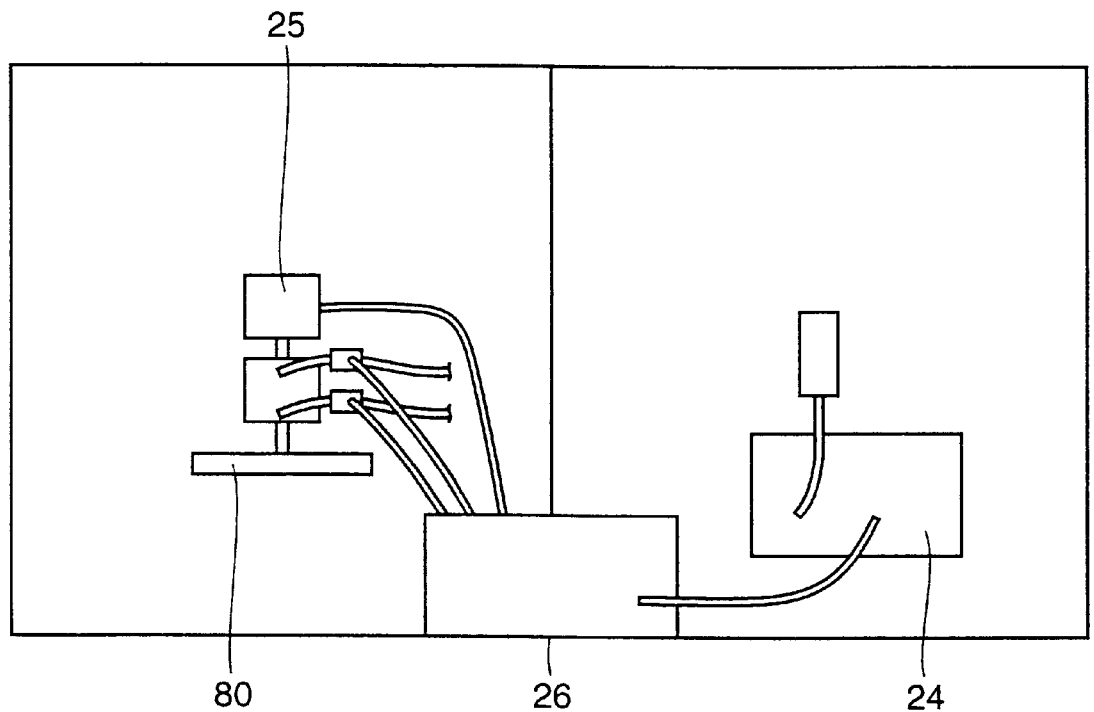
FIG. 5 is a schematic diagram showing a mounting apparatus according to the second embodiment of the present invention.

If the mounting apparatus of the present invention is adapted to connect thermocompression apparatus 25 to stretch amount detecting unit 24 as in FIG. 5 to provide real time feed back control, the problem associated with displacement inconsistency can be rapidly eliminated on a production line, which is preferable. In addition, higher repeatability is provided.

In FIG. 5, the thermocompression apparatus of the first embodiment may be employed in place of thermocompression apparatus 25.

Third Embodiment

Figure 7:
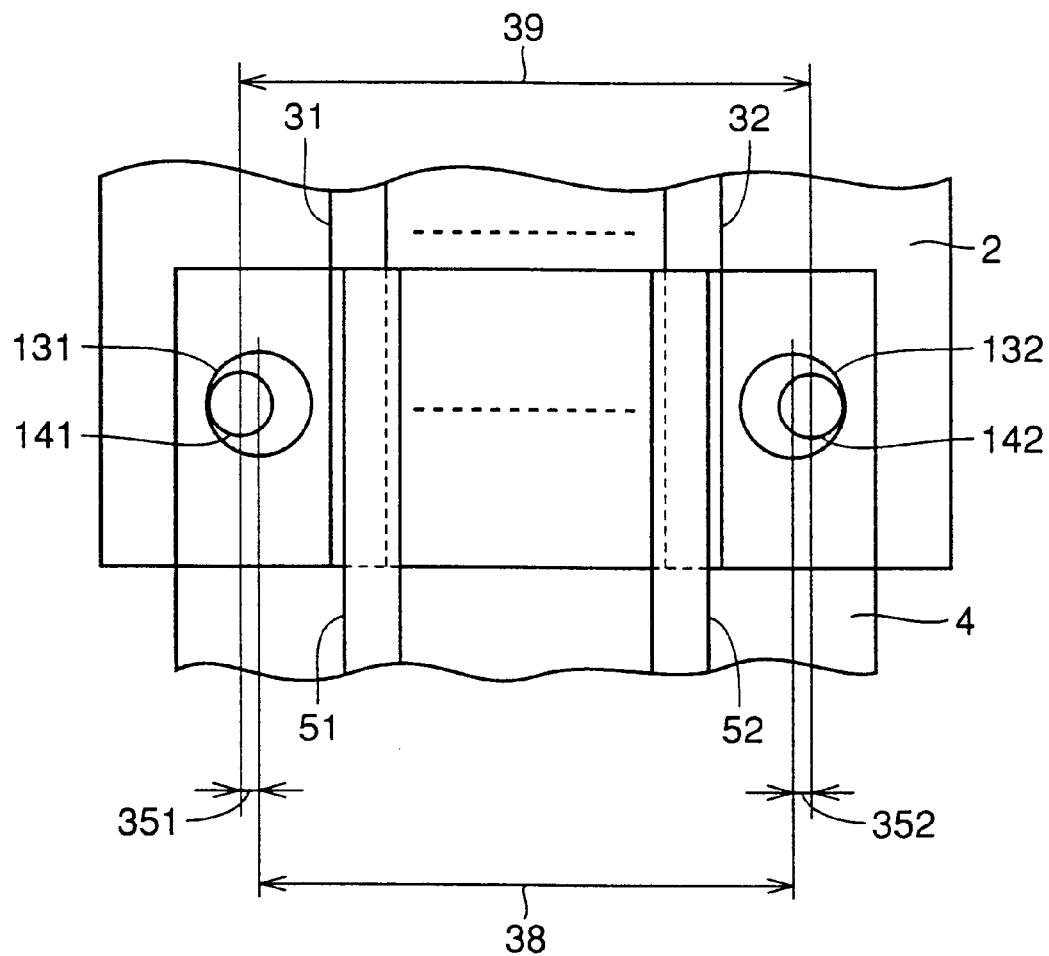
FIG. 7 is a top view showing preliminary bonded components according to a third embodiment of the present invention.

Referring to FIG. 7, a mounting apparatus according to the third embodiment of the present invention will be described. In the present embodiment, preliminary bonding is performed and followed by image pickup and detection. The term "preliminary bonding" means that a relative positional relationship between liquid crystal display 2 and flexible printed circuit board 4 is preliminary fixed before "regular bonding" which provides for permanent bonding of liquid crystal display 2 and flexible printed circuit board 4.

Referring to FIG. 7, flexible printed circuit board 4 is preliminary bonded to liquid crystal display 2. Although FIG. 7 is similar to FIG. 2 of the first embodiment, in FIG. 7, flexible printed circuit board 4 is not yet thermally expanded to a large extent in the width direction since it has merely been subjected to preliminary bonding.

After the preliminary bonding, relative displacement amounts 351 and 352 of positioning patterns 131 and 132 respectively with respect to reference patterns 141 and 142 of liquid crystal display 2 are detected by image processing apparatus 17 provided with an image pickup device 16. Based on the resultant relative displacement amounts 351 and 352, a rate at which a pitch 38 between positioning patterns 131 and 132 should stretch during subsequent regular bonding (hereinafter simply referred to as "a required stretch rate") is calculated. Based on the obtained required stretch rate, a current stretch amount between terminal electrodes 51 and 52 at both ends of the terminal electrodes of flexible printed circuit board 4 is calculated, and a difference between a design value and the current stretch amount is calculated to find a correction amount of the pitch between terminal electrodes 51 and 52.

In the mounting apparatus, curve data representing a required load as in the graph of FIG. 6 is stored as preliminary verified data for various values of correction amount of the pitch between terminal electrodes 51 and 52. Referring to data for the currently obtained correction amount of pitch between terminal electrodes 51 and 52 and performing an operation process if necessary, a desirable control method of the heater head is determined. The heater head is controlled to quantitatively control the stretch amount of pitch between terminal electrodes 51 and 52.

Fourth Embodiment

Figure 8:
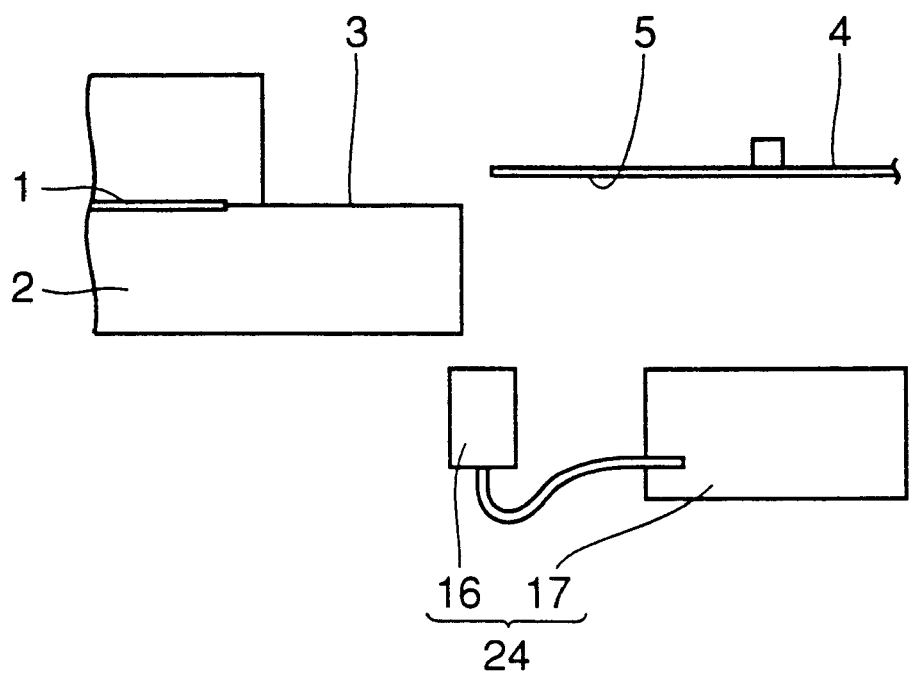
FIG. 8 is a schematic diagram showing a thermocompression apparatus according to a fourth embodiment of the present invention.
Figure 9:
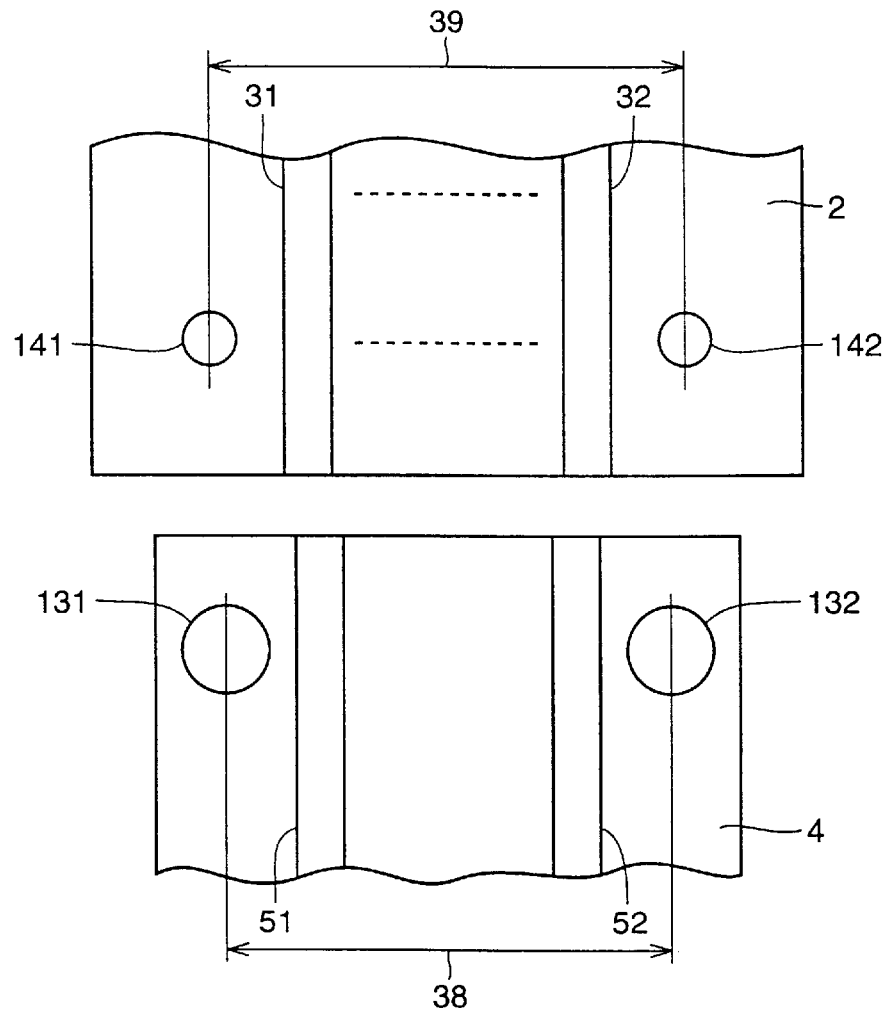
FIG. 9 is a top view of components before preliminary bonding according to the fourth embodiment of the present invention.
Figure 10:
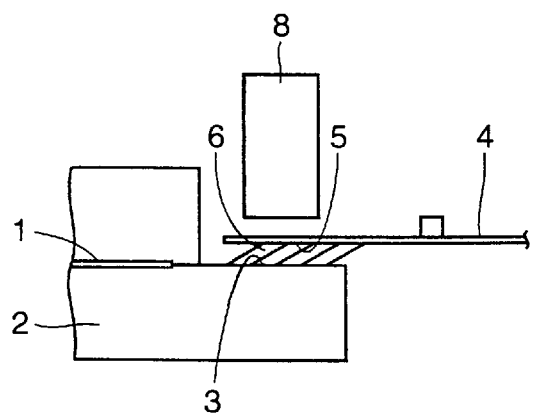
FIG. 10 is a diagram shown in conjunction with a prior art mounting operation.
Figure 11:
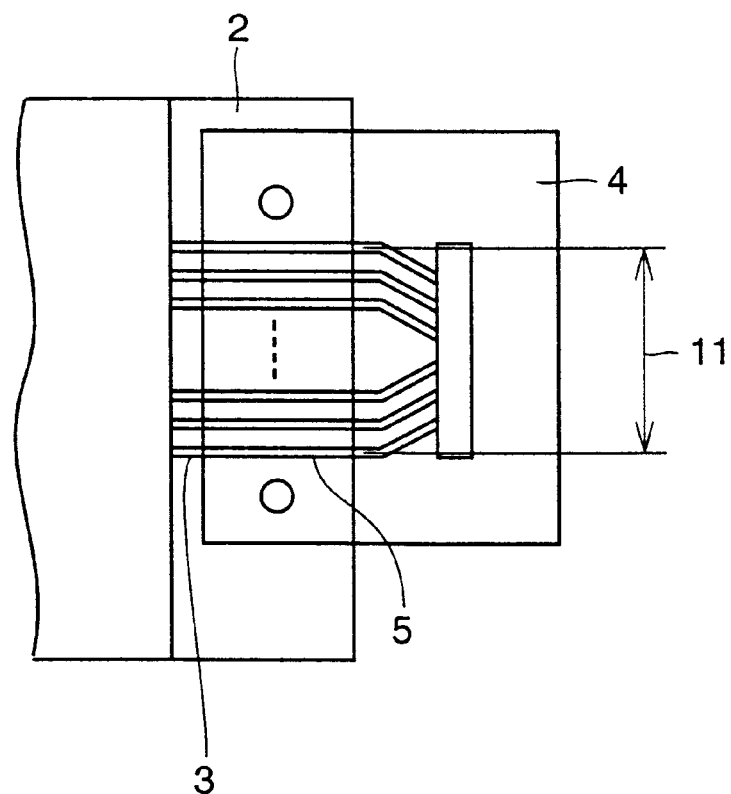
FIG. 11 is a top view of thermocompressed components of the prior art.
Figure 12:
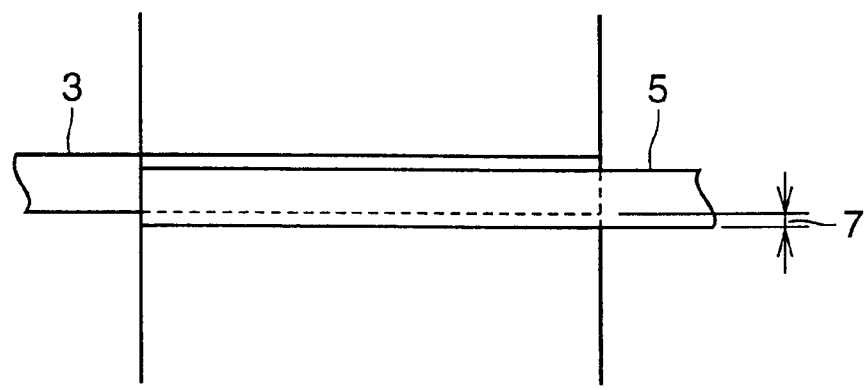
FIG. 12 is a diagram showing in enlargement thermocompressed terminal electrodes of the prior art.
Figure 13:
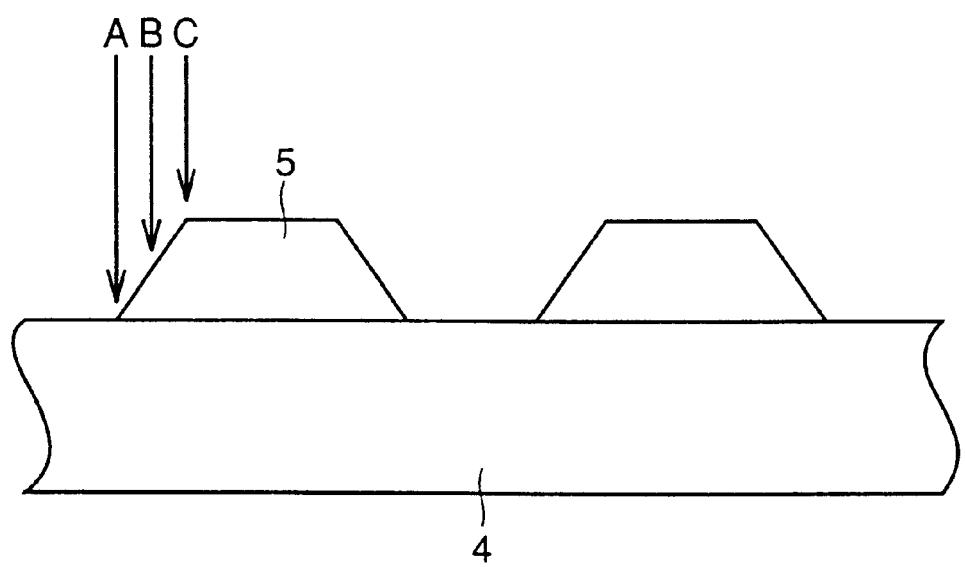
FIG. 13 is a cross sectional view showing the terminal electrode.

Referring to FIGS. 8 and 9, a mounting apparatus according to the fourth embodiment of the present invention will be described. In the present embodiment, preliminary bonding is performed after image pickup and detection.

FIG. 8 shows the mounting apparatus before preliminary bonding. Liquid crystal display 2 and flexible printed circuit board 4 are close to each other, but not yet overlap when viewed from above. In this state, image pickup device 16 provided in stretch amount detecting unit 24 takes images of front edge portions of liquid crystal display 2 and flexible printed circuit board 4. The resultant images are as shown in FIG. 9. Positioning patterns 131 and 132 of flexible printed circuit board 4 are detected by image processing apparatus 17 and a pitch 38 between positioning patterns 131 and 132 is obtained. Further, reference patterns 141 and 142 of liquid crystal display 2 are detected by image processing apparatus 17, and a pitch 39 between reference patterns 141 and 142 is obtained. A required stretch rate of pitch 38 is calculated from pitches 38 and 39. The subsequent operation is the same as in the third embodiment.

According to the present invention, the stretch amount of the flexible printed circuit board can be controlled. Thus, the stretch amount can be measured accurately and rapidly without relying on personal judgement and experience of the operator, whereby variation in stretch amount can be eliminated. As a result, displacement inconsistency can be avoided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A mounting apparatus, comprising:
    a heater head for bonding by thermocompression a display board and a flexible printed circuit board in such a way that a first terminal electrode row of said display board and a second terminal electrode row of said flexible printed circuit board are electrically connected;
    heater head driving means for driving said heater head in such a way that said heater head compresses said display board and said flexible printed circuit board by a prescribed load; and
    stretch amount controlling means for adjusting a load change per unit of time after said heater head driving means starts compressing said heater head against said flexible printed circuit board as well as a time at which a required load is attained to control a stretch amount of said second terminal electrode row caused by the thermocompression.

2. The mounting apparatus according to claim 1, further comprising:
    displacement amount detecting means for detecting a displacement amount of positioning patterns formed on either side of said second terminal electrode row with respect to reference patterns formed on either side of said first terminal electrode row;
    stretch amount calculating means for calculating the stretch amount of said second terminal electrode row based on said displacement amount; and
    correction amount calculating means for calculating a correction amount corresponding to a difference between stretch amounts of said first and second terminal electrode rows based on the stretch amount of said second terminal electrode row.

3. The mounting apparatus according to claim 2, wherein said stretch amount controlling means controls by feeding back said correction amount.

4. The mounting apparatus according to claim 2, further comprising data holding means for holding data regarding a relationship between an operation parameter and the stretch amount of said second terminal electrode row, wherein said stretch amount controlling means determines a necessary control method from data held in said data holding means based on said correction amount for control.

5. A mounting apparatus, comprising:
    a heater head bonding by thermocompression a display board and a flexible printed circuit board in such a way that a first terminal electrode row of said display board and a second terminal electrode row of said flexible printed circuit board are electrically connected;
    heater head driving means for driving said heater head in such a way that said heater head compresses said display board and said flexible printed circuit board by a prescribed load; and
    stretch amount controlling means for adjusting a speed at which said heater head driving means drives said heater head toward said flexible printed circuit board to control a stretch amount of said second terminal electrode row caused by the thermocompression.

6. The mounting apparatus according to claim 5, further comprising:
    displacement amount detecting means for detecting a displacement amount of positioning patterns formed on either side of said second terminal electrode row with respect to reference patterns formed on either side of said first terminal electrode row;
    stretch amount calculating means for calculating the stretch amount of said second terminal electrode row based on said displacement amount; and
    correction amount calculating means for calculating a correction amount corresponding to a difference between stretch amounts of said first terminal electrode row and said second terminal electrode row based on the stretch amount of said second terminal electrode row.

7. The mounting apparatus according to claim 6, wherein said stretch amount controlling means controls by feeding back said correction amount.

8. The mounting apparatus according to claim 6, further comprising data holding means for holding data regarding a relationship between an operation parameter and the stretch amount of said second terminal electrode row, wherein said stretch amount controlling means determines a necessary control method from data held in said data holding means based on said correction amount for control.

* * * * *